United States Patent [19]

Jakob et al.

[11] Patent Number: 5,777,850
[45] Date of Patent: Jul. 7, 1998

[54] BUILT-IN CONTROL DEVICE FOR ACTUATING LOADS WITH CONDUCTOR FOIL-COVERED PRINTED CIRCUIT BOARD

[75] Inventors: Gert Jakob, Stuttgart; Ralph Schimitzek, Moeckmuchl, both of Germany

[73] Assignee: Robert Bosch GmbH, Stuttgart, Germany

[21] Appl. No.: 553,680

[22] PCT Filed: Jun. 10, 1994

[86] PCT No.: PCT/DE94/00648

§ 371 Date: Nov. 30, 1995

§ 102(e) Date: Nov. 30, 1995

[87] PCT Pub. No.: WO95/00363

PCT Pub. Date: Jan. 5, 1995

[30] Foreign Application Priority Data

Jun. 26, 1993 [DE] Germany .................. 43 21 331.6

[51] Int. Cl.⁶ .................. H05K 1/14; H05K 5/02; H01R 9/09
[52] U.S. Cl. .................. 361/736; 361/749; 361/752; 361/755; 361/796; 439/76.2
[58] Field of Search .................. 174/254, 50.51; 257/678; 361/728, 736, 739, 742, 749, 752, 784, 789, 791, 795, 796, 803, 804, 755; 439/76.2, 67, 77, 949; 318/3, 4

[56] References Cited

FOREIGN PATENT DOCUMENTS

4225358A1  2/1994  Germany .

Primary Examiner—Donald Sparks
Attorney, Agent, or Firm—Michael J. Striker

[57] ABSTRACT

A built-on control device has a multicomponent housing (15) which is open on one side and is fitted onto the housing block (10) of a hydraulic unit. Arranged in the housing (16) of the built-on control device (15) is a printed circuit board (29) for an electronic circuit with a plurality of electronic components (33). The printed circuit board (29) comprises a plurality of rigid regions (30, 25), one rigid region being formed by the lid (25) of the housing (16). A looplike flexible region (36), which comprises only the conductor foil (31), is located between the two rigid regions (25, 30). In addition, the conductor foil (31) projects beyond the rigid region (30) of the printed circuit board (29) and in this region (28) it is placed in contact with the connection pins (27) of the loads (12) of the hydraulic unit. Since the contact is made directly with the conductor foil (31) in the flexible region of the printed circuit board (29), tolerances can be easily compensated so that contact can be made easily and thus the built-on control device on the housing block (10) can be manufactured easily.

9 Claims, 3 Drawing Sheets

BUILT-IN CONTROL DEVICE FOR ACTUATING LOADS WITH CONDUCTOR FOIL-COVERED PRINTED CIRCUIT BOARD

BACKGROUND OF THE INVENTION

The invention is based on a built-on control device of the generic type of the main claim. A built-on control device of this kind is known for example from the post-published DE-PS 42 25 358.6. In this publication, a printed circuit board on which a conductor foil is mounted is arranged in a hoodlike single-component housing. Here, the printed circuit board is actually divided up into a plurality of rigid regions which, owing to the conductor foil, are connected by means of flexible sections. However, in the region of the rigid printed circuit board, the connections of the loads and also the connections of the plugs are placed in contact with the said printed circuit board. As a result, the respective connections of the printed circuit board have to be matched precisely to one another. In addition, the housing is of single-component construction, as a result of which the subsequent, or concluding production process is made more difficult.

SUMMARY OF THE INVENTION

The built-on control device according to the invention, has, in contrast, the advantage that it is easy to open for a concluding production process or for adjustment of the electronic components. The soldered connections of the control unit are thus easily accessible. Since the conductor foil is arranged directly on the inside of the lid, a good cooling effect, which in particular does not require any additional cooling elements in this region, is produced. In the region of the contact between the loads and the printed circuit board there is play owing to the elastic foil. As a result, the contacts cannot break off or be damaged in some other way. As a result of the use of an elastic foil, there is no risk of bending in the region of the loop between the rigid regions of the printed circuit board. The housing can be constructed in a very cost-effective way owing to its obliquely extending edge. The screw connections of the housing onto the hydraulic unit to be controlled are thus possible. The dissipation of heat from the electrical component is simplified. The length of the elastic region between the two rigid parts of the printed circuit board is reduced. Since the flexible foil is connected directly to the plug contacts, the printed circuit board can also be equipped with power components in this region. The seal between the built-on control device and the hydraulic unit is simple and satisfactory. In the case of multicomponent housings for the built-on control device, individual parts of the housing can be adapted to correspond to the external shape of the housing of the hydraulic unit, as a result of which additional power components, particularly those with large volumes, can be additionally installed in the built-on control device.

DESCRIPTION OF PREFERRED EMBODIMENTS

Figure 1:
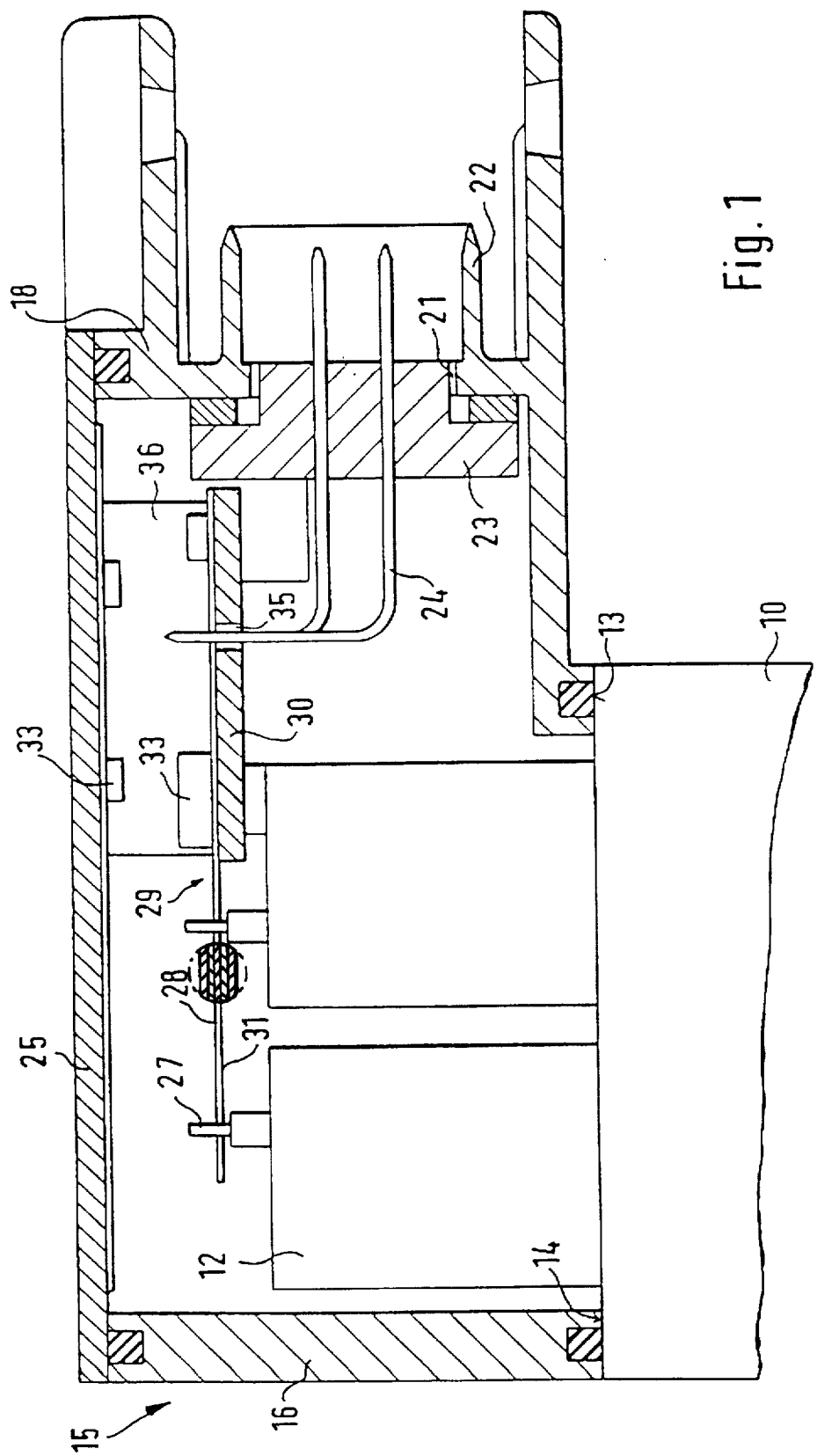
FIG. 1 is a view showing a section of a built-on control device in accordance with a first embodiment of the present invention.

In FIG. 1, 10 represents the only partially represented housing block of the hydraulic unit of a hydraulic anti-lock brake system (hydraulic brake system with traction control) onto which a motor (not illustrated) can be flanged, which motor interacts, in a manner known per se, with a hydraulic pump (not illustrated), arranged in the housing block 10, and with solenoid valves 12, also arranged in the housing block. The open end side of the built-on control device 15 bears against the end side 13 of the housing block 10 which is opposite the motor 11, the multicomponent housing 16 of the built-on control device 15 being constructed as a trough-shaped lid.

A plurality of solenoid valves 12, two of which can be seen in FIG. 1, are arranged in the housing block 10 of the hydraulic unit. The said solenoid valves 12 project with their connection-side and drive-side ends into the interior 17 of the built-on control device 15.

The housing 16 has in the frame 18 a lateral plug opening 21 with a collar-shaped receptacle shaft 22. The male connector 23 is inserted with the plug elements 24 into the plug opening 21 in a sealed fashion. One of the ends of the plug elements 24 of the male connector 23 projects into the receptacle shaft 22. In addition, the housing 16 is closed off on the side opposite the solenoid valves 12 by a lid 25.

The connection pins 27 of the solenoid valves 12 are connected to the flexible region 28 of a printed circuit board 29, for example by soldering. The printed circuit board 29 comprises a heat conducting plate 30 on which a (flexible) conductor foil 31 is applied, which conductor foil 31 bears conductor tracks (not illustrated) on its free surface. These printed circuit boards are components of an electric circuit, only a few discrete components 33 of which are illustrated here. These discrete components 33 are preferably constructed as surface mounted devices. The electronic circuit serves, in a manner known per se, for actuating the solenoid valves 12 (loads) of the hydraulic anti-lock brake system.

Since, in the region of the connection pins 27 of the solenoid valves 12, the printed circuit board 29 only comprises the conductor foil 31, the pins 27 can be attached very easily. In particular, tolerance differences, which may arise when contact is made with a rigid printed circuit board, can be compensated. In the region of the plate 30, the printed circuit board 29 has soldering openings 35 through which the other ends of the plug elements 24 project. In addition, the conductor foil 31 is also applied on the inside of the lid 25. For this purpose, a second flexible loop-shaped region 36 is formed on the printed circuit board 29 between the plate 30 and the lid 25, in which region 36 the conductor foil 31 is located without a carrier plate. The length of this flexible region 36 is to be matched here in such a way that the lid 25 can be folded open. As a result, it is possible for power components 33 also to be mounted on the inside of the lid 25, as a result of which the surface mounting density of the printed circuit board 29 is increased. In addition, a suitable selection of the material for the lid can also permit the heat of the power components 33 to be easily dissipated without additional cooling elements. This also applies to the material of the plate 30.

If the lid 25 is folded open, all the regions of the printed circuit board 29 are accessible from one side. i.e. perpendicularly from above, and also lie in one plane so that all the processes can be carried out in one operational procedure and, above all, can be soldered in one procedure, for example the known reflow soldering process. Of course, in the loop-shaped region 26 the conductor foil 31 must not touch itself, in order to avoid an electric short circuit.

As a result of the direct connection of the solenoid valves 12 to the conductor foil 31 in the flexible region 28 of the printed circuit board 29, for example the plug connection elements are dispensed with and the manufacture of the built-on control device becomes simple since it is not necessary to observe precise tolerances here. At the same time, the conductor foil 31 also serves as a connection for the plug element 24 which leads to the outside. Using this plug element 24 the electronic circuit of the printed circuit board 29 can be supplied with input signals from sensors (e.g. rotation speed pickups). No separate connection lines are necessary between the electronic circuit on the printed circuit board 29 and the plug elements 24.

Usually, the built-on control device 15 and the load 10 are manufactured at two different locations or by two different producers. As a result, it is necessary to transport one of the two components, for example the built-on control device 15. For this, the lower opening 13, i.e. the opening 13 of the housing 16 facing the motor can be closed off by an additional lid as a seal against dust.

Figure 2:
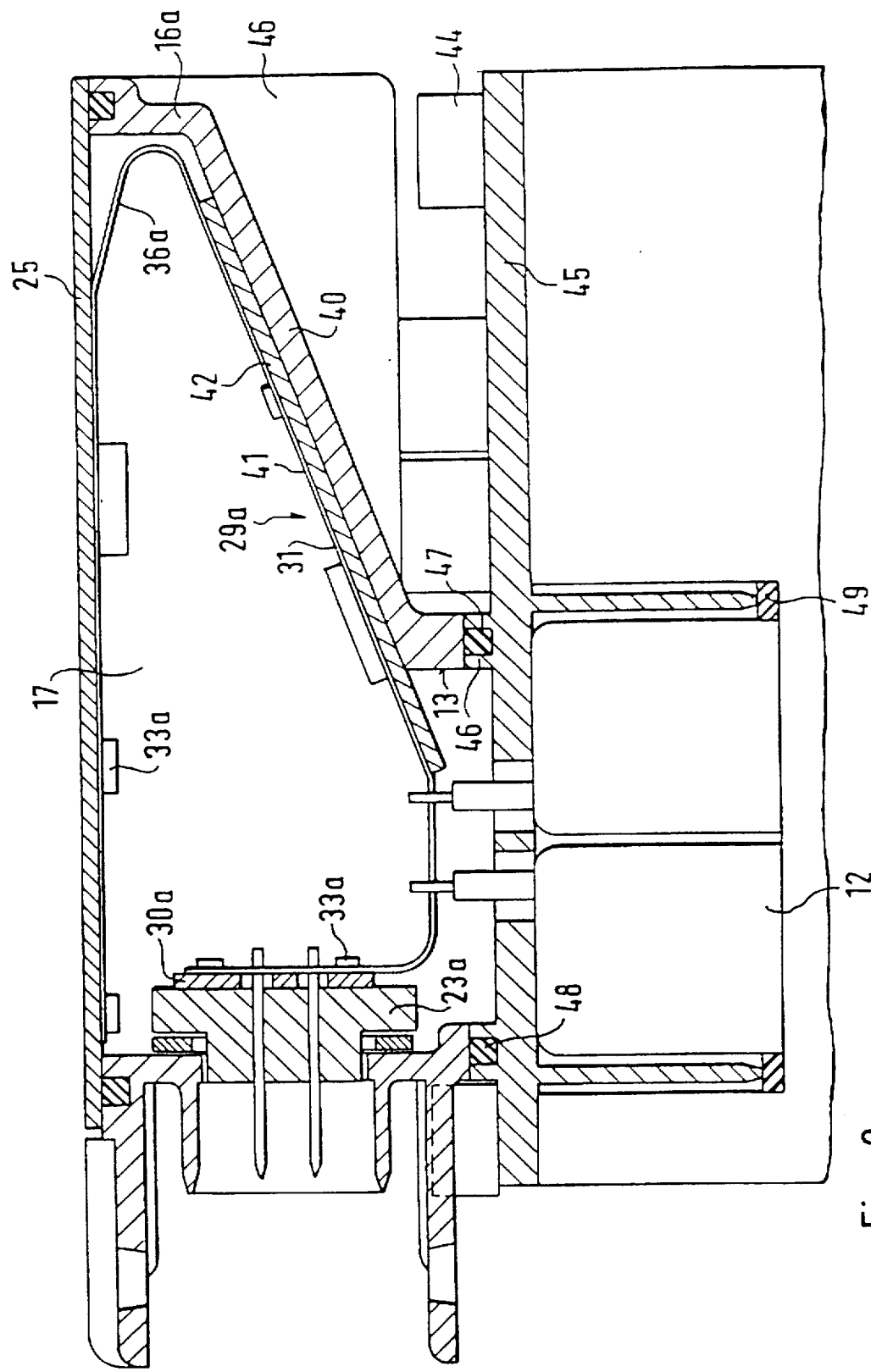
FIG. 2 is a view showing a built-on control device in accordance with a second embodiment of the present invention.

In the refinement according to FIG. 2, the housing 16A has at one point a wall with an obliquely extending section 40. A rigid region 41 of the printed circuit board 29A bears on this section 40. The region 41 of the printed circuit board 29 comprises a heat conducting carrier 42 on which the conductor foil 31 is applied, for example bonded. The obliquely extending section 40 of the printed circuit board 29 should lead as far as possible to the opening, and thus to the lid 25, so that the looplike section 36A of the printed circuit board 29A can be made as short as possible. In addition, the oblique section 40 should also lead as far as possible towards the other opening 13 through which the solenoid valves 12 project into the interior 17 of the built-on control device 15. As a result, the necessary bearing region of the built-on device 15 on the motor 10 is minimized and the screwed connections of the connection plate 45 of the motor 10 are easily accessible and they can also be arranged under the housing 16A of the built-on control device in a space saving fashion. For easy and reliable dissipation of heat, ribs 46 are formed on the housing 16A of the built-on control device 15 in the region of the oblique section 40. By virtue of the slope of the section 40, these ribs 46 can also be formed without additional space being required between the wall of the housing 16A and the plate 45 of the motor 10. In addition, in contrast with FIG. 1, the plate 30A of the printed circuit board 29A is attached directly to the male connector 23A. This permits a compact design since power components 33A are even to be arranged on the male connector 23A.

In addition, it is important that there is a pressuretight connection between the housing 16A of the built-on control device 15 and the housing of the motor 10A. For this purpose, the pressure plate 45 has a circumferential claw 46 in which a groove 47 for a sealing ring 48 is formed. In addition, the pressure plate 45 has an edge 48 which projects into the housing of the motor 10A or of the load and is also sealed using a sealing ring 49. As a result, a pressure-tight connection is produced, both with respect to the housing 16A of the built-on device 15 and with respect to the housing of the motor 10A, using the pressure plate 45.

Figure 3:
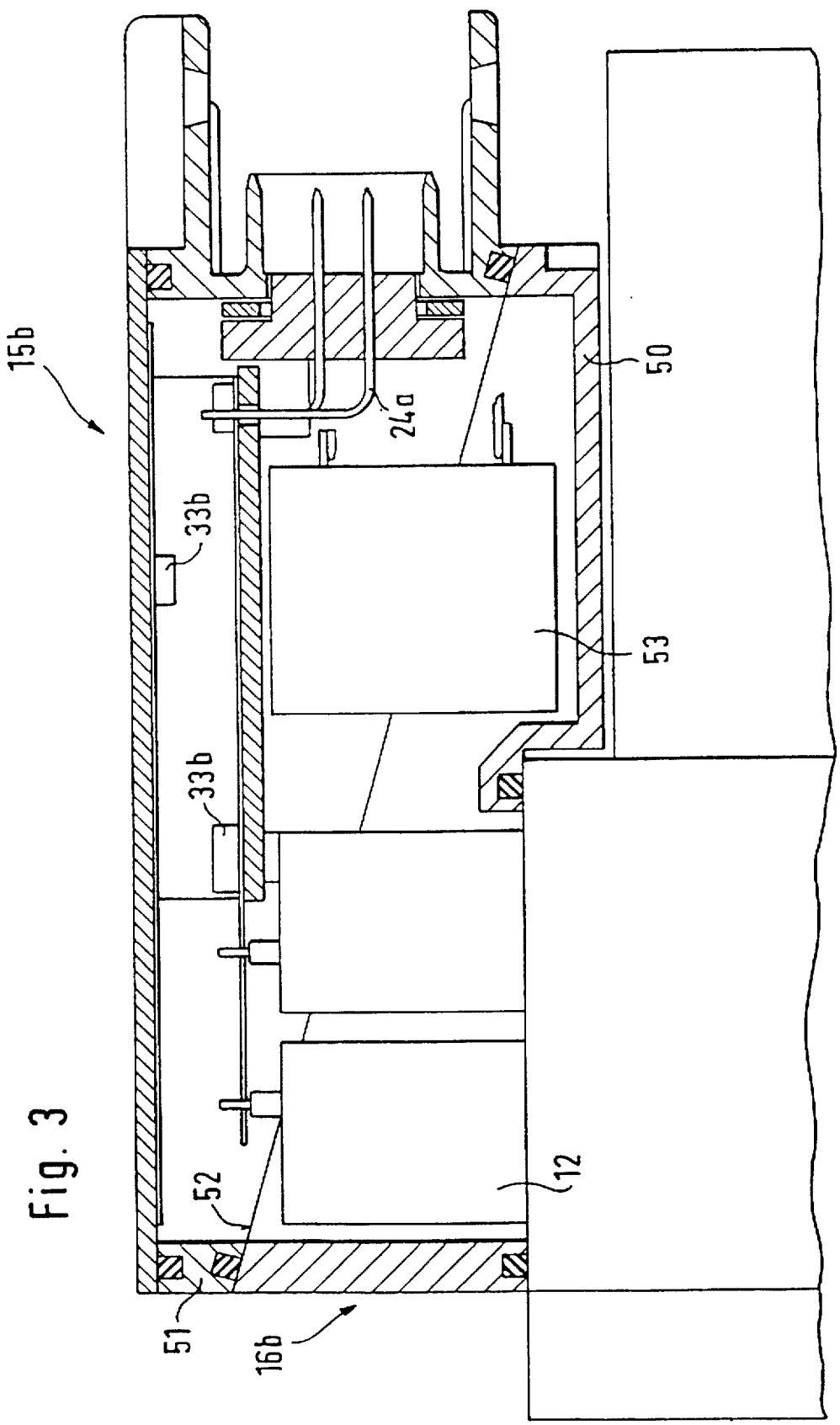
FIG. 3 is a view showing a built-in control device in accordance with a third embodiment of the present invention.

The design according to FIG. 3 serves to accommodate also relatively large electrical or electronic components, such as for example a relay 53 in the housing 16B of the built-on device 15B, the intention being however that the housing 16B will continue to be of compact design. For this purpose, the frame of the housing 16B is, in contrast with the designs according to FIGS. 1 and 2, of multicomponent construction and comprises a trough-shaped base component 50 and a frame part 51 which is fitted on in a-sealed fashion. The bearing face 52 of the frame part 51 on the base component 50 extends obliquely so that the frame part 51 receives the entire plug and the printed circuit board 29. The electrical components 33B and the connections of a relay 53 and the connections of the solenoid valves 12 thus continue to be accessible, and capable of being mounted, vertically. This is possible since the relay 53 is connected to the plug elements 24A and subsequently the base component 50 is fitted onto the frame part 51 as a lid. Furthermore, during mounting and construction the same procedure can be adopted for the exemplary embodiment described above as according to FIG. 1 and FIG. 2.

The use of the built-on device is not restricted to the anti-lock brake systems (hydraulic anti-lock brake systems) or hydraulic brake systems with traction control described in the exemplary embodiments. It is also possible to use it, inter alia, in traction control systems, combined anti-lock/traction control systems or in fuel injection systems and other combinations of electronic units (control device and loads).

We claim:

1. A built-on control device for actuating loads, comprising a housing; a power output stage received in said housing and having at least one printed circuit board extending in a longitudinal direction and provided with an electronic circuit; connection elements adapted to connect said printed circuit board and loads and projecting into said housing, said housing being formed so that it opens toward the loads and bears on the loads; at least one plug element connected to the circuit and accessible from outside of said housing for connecting sensors, said printed circuit board being provided with a conductor foil, said connection elements and said plug elements being directly connected to said conductor foil, said housing having two housing components, said printed circuit board including a plurality of rigid parts and flexible parts, at least two of said rigid parts being connected by one of said flexible parts, one of said two parts of said printed circuit board formed by an inside of one of said housing components, said conductor foil projecting beyond said printed circuit board in said longitudinal direction of said printed circuit board and being connected in a projecting region directly to said connection elements of the loads.

2. A built-on control device as defined in claim 1, wherein one of said housing components is a trough-shaped housing component, while another of said housing components is a lid which seals off an opening of said housing, said at least one part of said printed circuit board which is formed by the inside of said housing component being attached to an inside of said lid.

3. A built-on control device as defined in claim 2, wherein said conductor foil has a free section dimensioned such that it is possible to fold open said lid into a plane of the other of said rigid parts of said printed circuit board.

4. A built-on control device as defined in claim 1; and further comprising a heat conducting carrier, said conductor foil being arranged at least partially in the region of said rigid parts on said heat conducting carrier.

5. A built-on control device as defined in claim 1, wherein said plug component is arranged on one end side of said conductor foil.

6. A built-on control device as defined in claim 1, wherein said circuit has discrete components which are arranged as surface-mounted devices on said conductor foil.

7. A built-on control device as defined in claim 1, wherein said conductor foil has said rigid parts at least in two planes lying one on top of the other.

8. A built-on control device as defined in claim 1, wherein said conductor foil is formed as a multi-layer technology-produced foil.

9. A built-on control device for actuating loads, comprising a housing; a power output stage received in said housing and having at least one printed circuit board extending in a longitudinal direction and provided with an electronic circuit; connection elements adapted to connect said printed circuit board and loads and projecting into said housing, said housing being formed so that it opens toward the loads and bears on the loads; at least one plug element connected to the circuit and accessible from outside of said housing for connecting sensors, said printed circuit board being provided with a conductor foil, said connection elements and said plug elements being directly connected to said conductor foil, said housing having two housing components, said printed circuit board including a plurality of rigid parts and flexible parts, at least two of said rigid parts being connected by one of said flexible parts, one of said two parts of said printed circuit board formed by an inside of one of said housing components, said conductor foil projecting beyond said printed circuit board in said longitudinal direction of said printed circuit board and being connected in a projecting region directly to said connection elements of the loads, one of said housing components being a trough-shaped housing component, while another of said housing components is a lid which seals off an opening of said housing, said at least one part of said printed circuit board which is formed by the inside of said housing component being attached to an inside of said lid, said trough-shaped housing component including a base component and a collar-shaped part with an intersection line extending obliquely between said base component and said collar-shaped part.

\* \* \* \* \*